US010903422B2

(12) United States Patent
Leobandung

(10) Patent No.: US 10,903,422 B2
(45) Date of Patent: Jan. 26, 2021

(54) VERTICALLY ORIENTED MEMORY STRUCTURE

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/381,406

(22) Filed: Apr. 11, 2019

(65) Prior Publication Data

US 2020/0328349 A1 Oct. 15, 2020

(51) Int. Cl.
*H01L 45/00* (2006.01)
*H01L 27/24* (2006.01)
*H01L 23/528* (2006.01)

(52) U.S. Cl.
CPC ........ *H01L 45/1233* (2013.01); *H01L 23/528* (2013.01); *H01L 27/2436* (2013.01); *H01L 45/06* (2013.01); *H01L 45/1253* (2013.01); *H01L 45/144* (2013.01); *H01L 45/1608* (2013.01); *H01L 45/1675* (2013.01)

(58) Field of Classification Search
CPC ... H01L 45/06; H01L 45/1233; H01L 45/124; H01L 45/126; H01L 45/144; H01L 45/1666
See application file for complete search history.

(56) References Cited

U.S. PATENT DOCUMENTS

| 8,493,772 | B2 | 7/2013 | Liu |
| 8,553,453 | B2 | 10/2013 | Pellizzer et al. |
| 8,680,499 | B2 | 3/2014 | Erbetta et al. |
| 9,246,093 | B2 | 1/2016 | Zanderighi et al. |
| 9,748,480 | B2 | 8/2017 | Redaelli et al. |
| 9,881,971 | B2 | 1/2018 | Lindenberg |
| 10,056,331 | B2 | 8/2018 | Jacob et al. |
| 10,096,655 | B1 | 10/2018 | Pellizzer et al. |
| 2008/0265238 | A1* | 10/2008 | Chen ........................ H01L 45/06 257/3 |
| 2009/0220744 | A1 | 9/2009 | Martinez, Jr. et al. |
| 2009/0221146 | A1* | 9/2009 | Seko .................... H01L 45/1233 438/694 |
| 2011/0278531 | A1* | 11/2011 | Erbetta .................... H01L 45/04 257/4 |
| 2014/0367630 | A1 | 12/2014 | Asano |

OTHER PUBLICATIONS

Burr, "Experimental Demonstration and Tolerancing of a Large-Scale Neural Network (165 000 Synapses) Using Phase-Change Memory as the Synaptic Weight Element", IEEE Transactions on Electron Devices, vol. 62, No. 11, Nov. 2015, pp. 3498-3507.

* cited by examiner

*Primary Examiner* — Dung A. Le
(74) *Attorney, Agent, or Firm* — Tutunjian & Bitetto, P.C.; Randall Bluestone

(57) ABSTRACT

A method for fabricating a semiconductor device including a vertically oriented memory structure includes forming at least one pillar including phase-change memory (PCM) material on at least one electrode, forming a plurality of spacers on the electrode and along sidewalls of the pillar, and forming, by processing the plurality of spacers and the pillar, a modified pillar having a vertically oriented dumbbell shape associated with a vertically oriented PCM memory structure.

20 Claims, 10 Drawing Sheets

US 10,903,422 B2

VERTICALLY ORIENTED MEMORY STRUCTURE

BACKGROUND

The present invention generally relates to semiconductor devices, and more particularly to vertically oriented memory structures and methods of forming the same.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is phase-change memory (PCM). PCM can exploit semiconducting properties of phase-change materials, such as, e.g., chalcogenide glass, that include amorphous and crystalline phases. Information can be stored in the amorphous and crystalline phases, which can be reversibly switched by applying an external voltage. Information can be read by measuring a resistance of the PCM cell. PCM technology can be used for electronic synapse devices, memristors for neuromorphic or analog computing, and high-density/high-speed non-volatile memory applications.

SUMMARY

In accordance with an embodiment of the present invention, a method for fabricating a semiconductor device including a vertically oriented memory structure is provided. The method includes forming at least one pillar including phase-change memory (PCM) material on at least one electrode, forming a plurality of spacers on the electrode and along sidewalls of the pillar, and forming, by processing the plurality of spacers and the pillar, a modified pillar having a vertically oriented dumbbell shape associated with a vertically oriented PCM memory structure.

In accordance with another embodiment of the present invention, a method for fabricating a semiconductor device including a vertically oriented memory structure is provided. The method includes forming at least one electrode on a base structure within a first dielectric capping layer, and forming a pillar including phase-change memory (PCM) material on the electrode. Forming the pillar includes forming a first conductive liner on the electrode, forming the PCM material on the first conductive liner, and forming a second conductive liner on the PCM material. The method further includes forming a plurality of spacers on the electrode and along sidewalls of the pillar, including forming a first spacer on the electrode, a second spacer on the first spacer, and a third spacer on the second spacer. The method further includes forming, by processing the plurality of spacers and the pillar, a modified pillar having a vertically oriented dumbbell shape associated with a vertically oriented PCM memory structure. Forming the modified pillar includes removing the second spacer using a wet etch process, and recessing the PCM material to have the vertically oriented dumbbell shape.

In accordance with yet another embodiment of the present invention, a semiconductor device including a vertically oriented memory structure is provided. The device includes a base structure, at least one electrode disposed on the base structure within a first dielectric capping layer, a modified pillar disposed on the electrode, and a second electrode disposed on the modified pillar within a second dielectric capping layer. The modified pillar has a vertically oriented dumbbell shape associated with a vertically oriented phase-change memory (PCM) memory structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
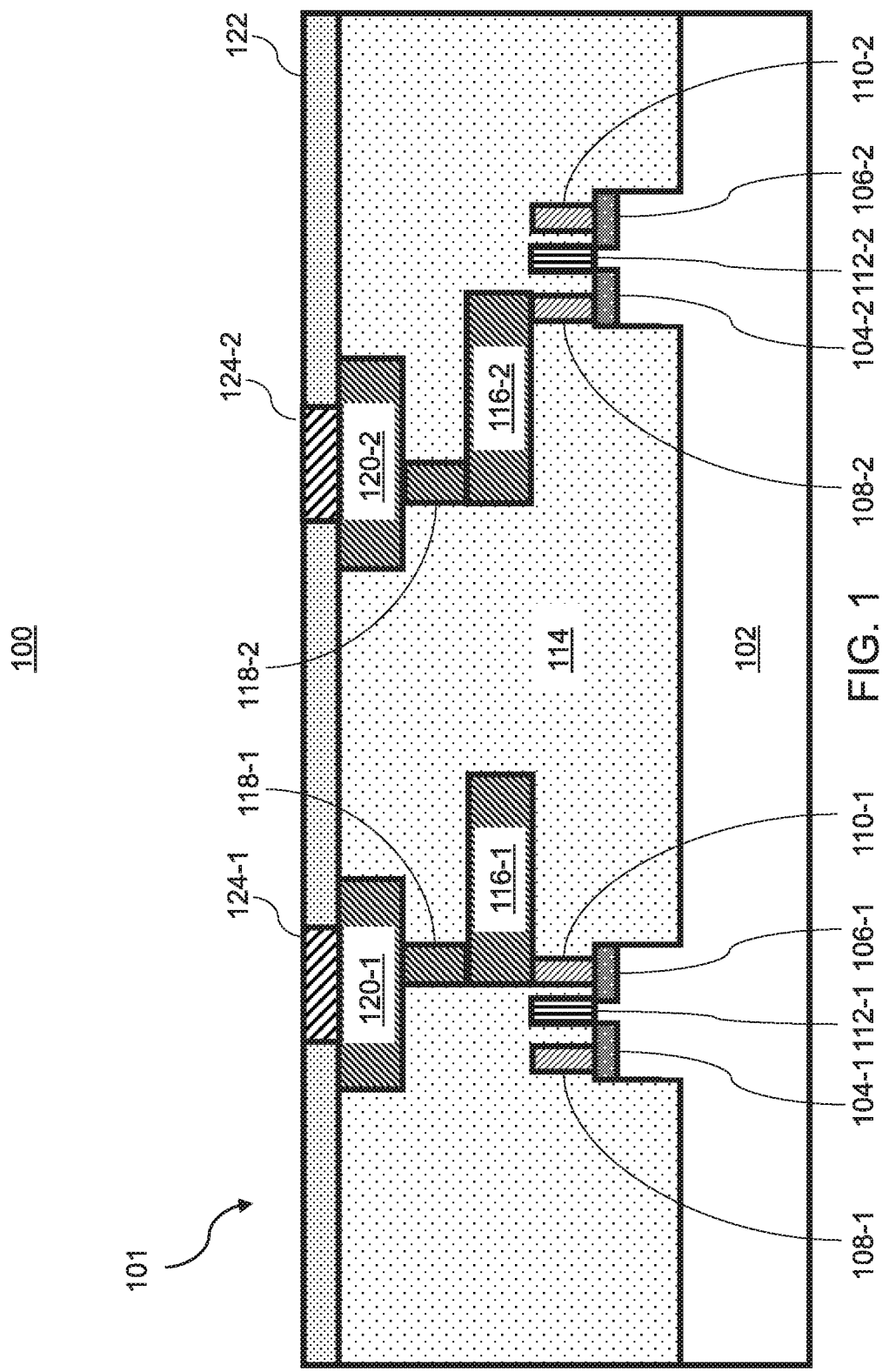
FIG. 1 is a cross-sectional view of the formation of lower electrodes within a base structure during the fabrication of a semiconductor device including a vertically constricted memory structure, in accordance with an embodiment of the present invention.

The embodiments described herein provide for semiconductor devices including a vertically oriented memory structure. More specifically, the semiconductor devices can include memory devices having vertically oriented phase-change memory (PCM) cells. The vertically oriented PCM cells can be formed by modifying pillars of PCM material to have vertically oriented dumbbell shapes, such that ends of the pillars can be connected by a vertical bridge of the PCM material.

Such vertically constricted PCM cells can increase efficiency and can consume less area as compared to, e.g., horizontally constricted (bridge) PCM cells. For example, horizontal PCM memory cells can be large due to the layout of such horizontally constricted PCM memory cells.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view of a semiconductor device 100 is provided. In this illustrative embodiment, the device 100 includes a phase-change memory (PCM) structure. However, the device 100 can include any suitable memory structure(s) in accordance with the embodiments described herein.

The device 100 includes a base structure 101. For example, as shown, the base structure 101 can include front-end-of-line (FEOL) and back-end-of-line (BEOL) structures.

For example, the base structure 101 can include a substrate 102 having multiple layers formed thereon. The substrate 102 can include any suitable substrate structure, e.g., a bulk semiconductor, a semiconductor-on-insulator (SOI) substrate, etc.

In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The base structure 101 can further include source/drain regions 104-1 and 104-2, drain/source regions 106-1 and 106-2, source/drain contacts 108-1 and 108-2 formed on respective ones of the source/drain regions 104-1 and 104-2, drain/source contacts 110-1 and 110-2 formed on respective ones of the drain/source contacts 106-1 and 106-2, and gate contacts 112-1 and 112-2. The contacts 108-1, 108-2, 110-1, 110-2, 112-1 and 112-2 can include any suitable conductive material(s) in accordance with the embodiments described herein.

The base structure 101 can further include BEOL metallizations. For example, as shown in FIG. 1, the base structure 101 can include first metallization layers 116-1 and 116-2 formed on drain/source contacts 110-1 and 110-2, respectively, and vias 118-1 and 118-2 connecting first metallization layers 116-1 and 116-2 to second metallization layers 120-1 and 120-2.

The first metallization layers 116-1 and 116-2, the vias 118-1 and 118-2, and the second metallization layers 120-1 and 120-2 can include any suitable conductive material(s) in accordance with the embodiments described herein. Examples of suitable conductive materials that the first metallization layers 116-1 and 116-2, the vias 118-1 and 118-2, and the second metallization layers 120-1 and 120-2 can be formed from include, but are not limited, copper (Cu), tungsten (W), etc.

The base structure 101 can further include a dielectric capping layer 122. The dielectric capping layer 122 can include any suitable dielectric material in accordance with the embodiments described herein. Examples of suitable dielectric materials that the dielectric capping layer 122 can be formed from include, but are not limited to, silicon nitride, silicon oxide, etc.

Lower electrodes 124-1 and 124-2 are formed within the dielectric capping layer 122 on the second metallization layers 120-1 and 120-2. The lower electrodes 124-1 and 124-2 can include any suitable conductive material in accordance with the embodiments described herein. Examples of suitable materials that the lower electrodes 124-1 and 124-2 can be formed from include, but are not limited to, tungsten (W), copper (Cu), etc.

Figure 2:
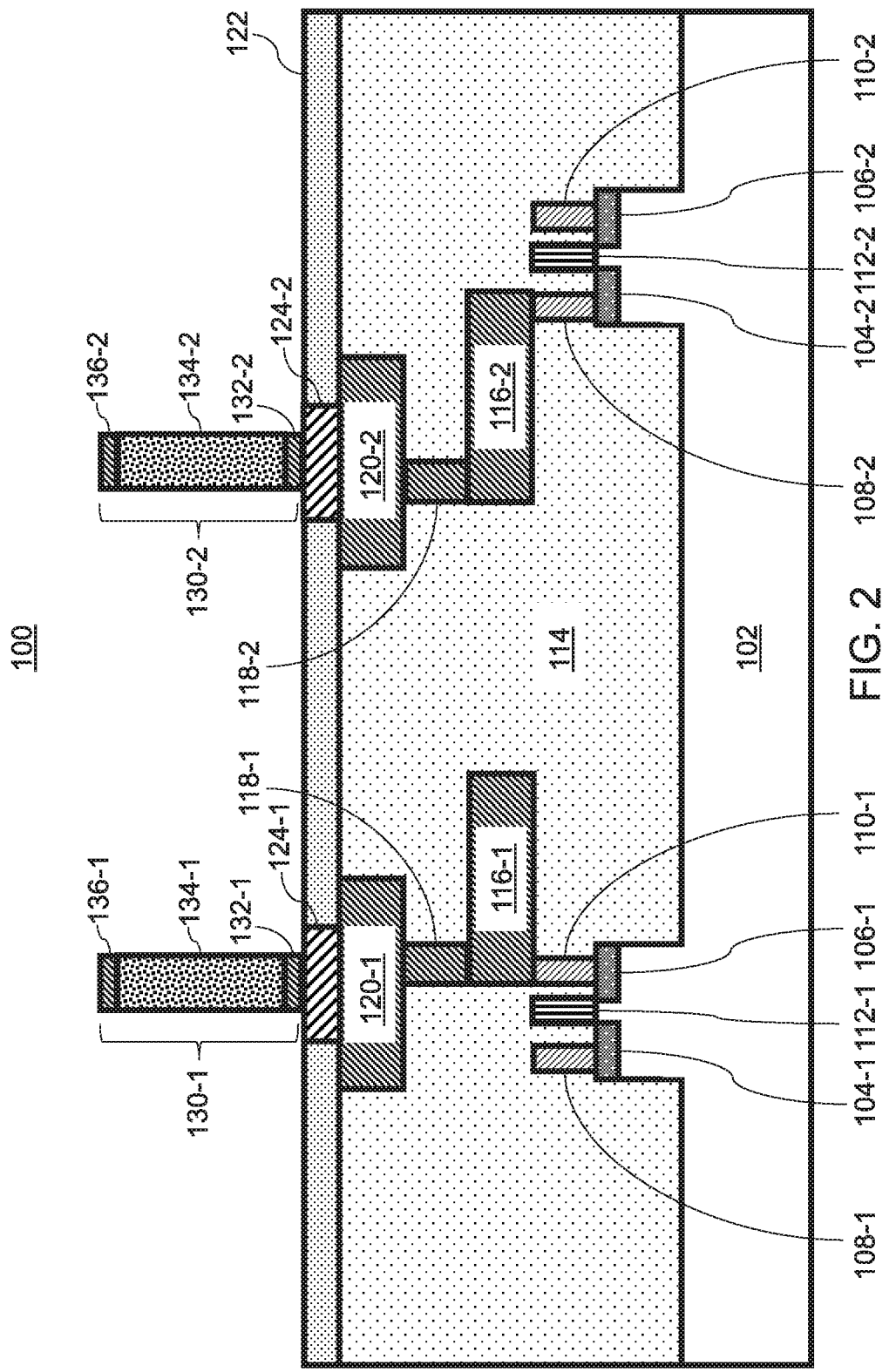
FIG. 2 is a cross-sectional view of the formation of pillars including phase-change memory (PCM) material on the lower electrodes during the fabrication of the semiconductor device, in accordance with an embodiment of the present invention.

With reference to FIG. 2, a pillar 130-1 is formed (e.g., patterned) on the lower electrode 124-1 and a pillar 130-2 is formed (e.g., patterned) on the lower electrode 124-2. More specifically, the pillar 130-1 can include a first conductive liner 132-1, PCM material 134-1, and a second conductive liner 136-1, and the pillar 130-2 can include a first conductive liner 132-2, PCM material 134-2, and a second conductive liner 136-2. The pillars 130-1 and 130-2 can include any suitable materials in accordance with the embodiments described herein.

More specifically, conductive liners 132-1, 132-2, 136-1 and 136-2 can be formed from a high-resistance conductive material (e.g., metal). Examples of suitable materials that conductive liners 132-1, 132-2, 136-1 and 136-2 can be formed from include, but are not limited to, tantalum nitride (TaN), titanium nitride (TiN), etc.

In one embodiment, the PCM materials 134-1 and 134-2 can each include a chalcogenide material. A chalcogenide material is a material formed from one or more chalcogens (e.g., sulfur (S), selenium (Se) and/or tellurium (Te)). For example, the chalcogenide material can include a chalcogenide glass. Examples of suitable materials that the PCM materials 134-1 and 134-2 can be formed from include, but are not limited to, germanium-antimony-tellurium (GeSbTe), silver-indium-antimony-tellurium (AgInSbTe), etc.

As mentioned above, chalcogenide materials can experience thermally-driven amorphous-to-crystalline phase changes. These properties of chalcogenide materials can be exploited in accordance with the embodiments described herein to encode binary information for use in, e.g., PRAM devices.

Figure 3:
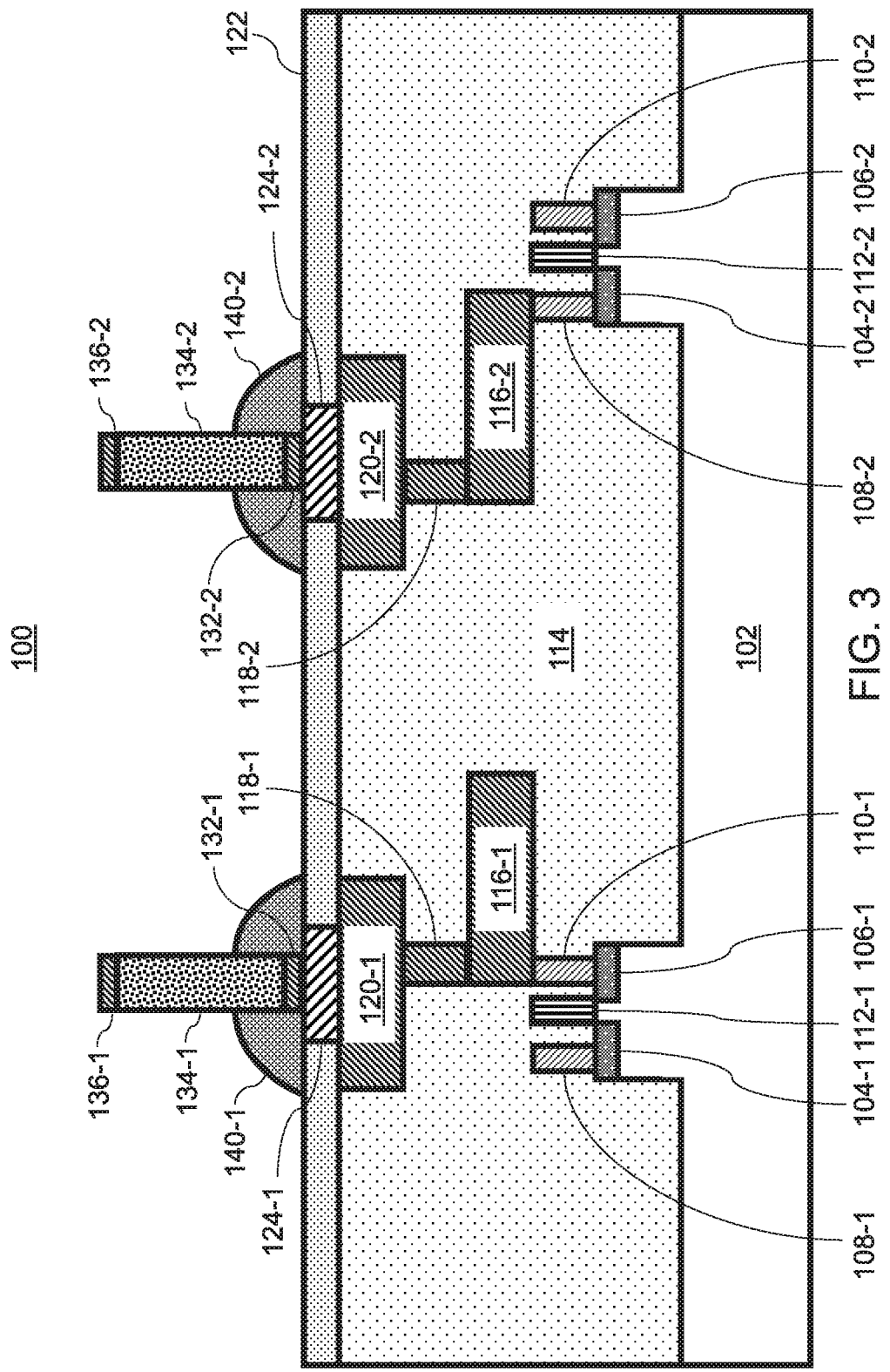
FIG. 3 is a cross-sectional view of the formation first spacers during the fabrication of the semiconductor device, in accordance with an embodiment of the present invention.

With reference to FIG. 3, first spacers 140-1 and 140-2 are formed on sidewalls of the pillars 130-1 and 130-2, respectively. The first spacers 140-1 and 140-2 can be formed by depositing dielectric material on the device 100 and etching the dielectric material to form the first spacers 140-1 and 140-2 as shown in FIG. 3. The first spacers 140-1 and 140-2 can include any suitable dielectric material in accordance with the embodiments described herein. Examples of suitable dielectric materials that can be used to form the first spacers 140-1 and 140-2 include, but are not limited to, silicon nitride, silicon oxide, amorphous carbon, boron nitride, etc. In one embodiment, the first spacers 140-1 and 140-2 include a nitride material.

Figure 4:
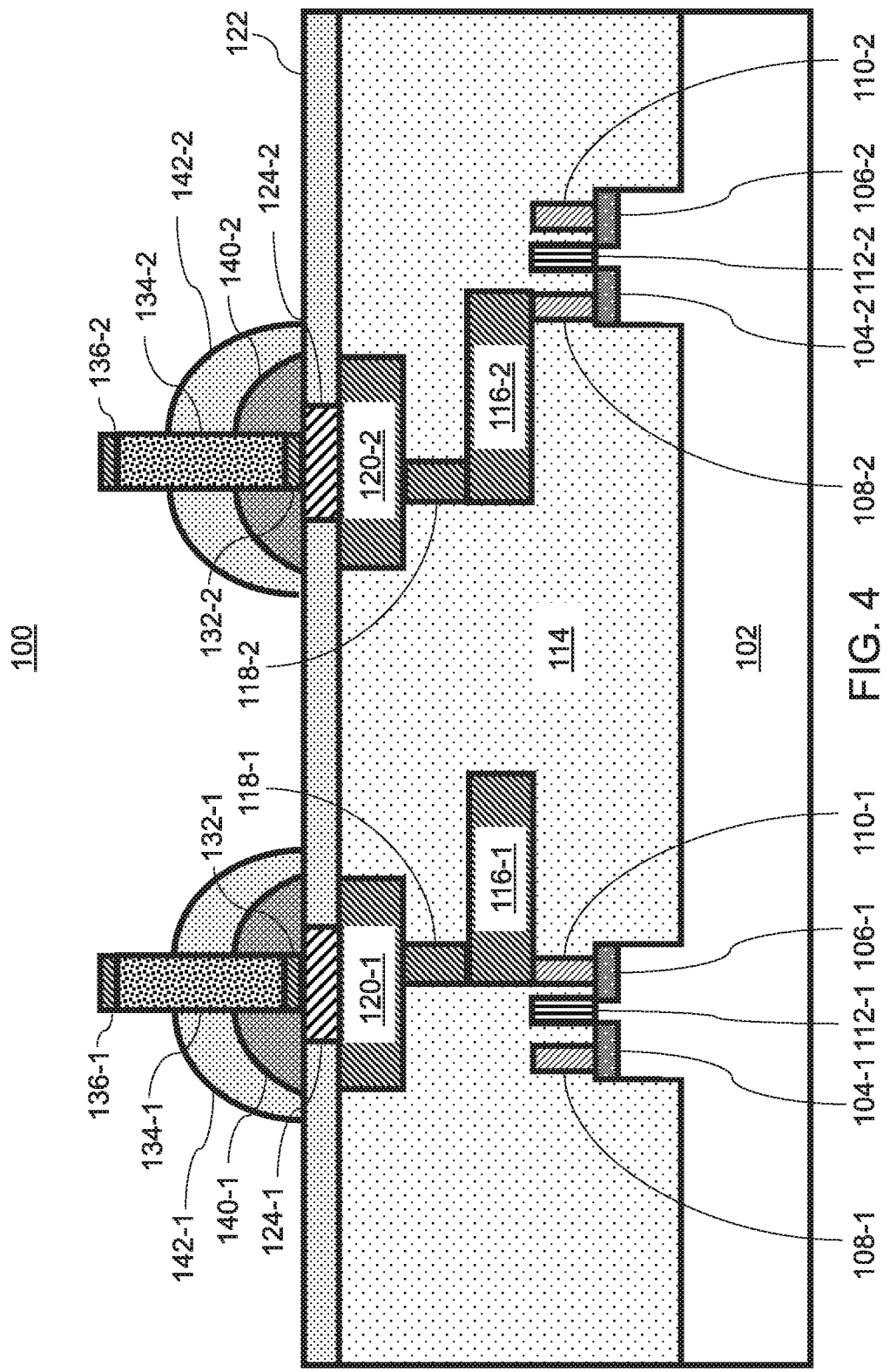
FIG. 4 is a cross-sectional view of the formation of second spacers during the fabrication of the semiconductor device, in accordance with an embodiment of the present invention.

With reference to FIG. 4, second spacers 142-1 and 142-2 are formed on the first spacers 140-1 and 140-2 and the sidewalls of the pillars 130-1 and 130-2, respectively. The second spacers 142-1 and 142-2 can be formed by depositing dielectric material on the device 100 and etching the dielectric material to form the second spacers 142-1 and 142-2 as shown in FIG. 4. The second spacers 142-1 and 142-2 can include any suitable dielectric material in accordance with the embodiments described herein. Examples of suitable dielectric materials that can be used to form the second spacers 142-1 and 142-2 include, but are not limited to, silicon nitride, silicon oxide, amorphous carbon, boron nitride, etc.

Figure 5:
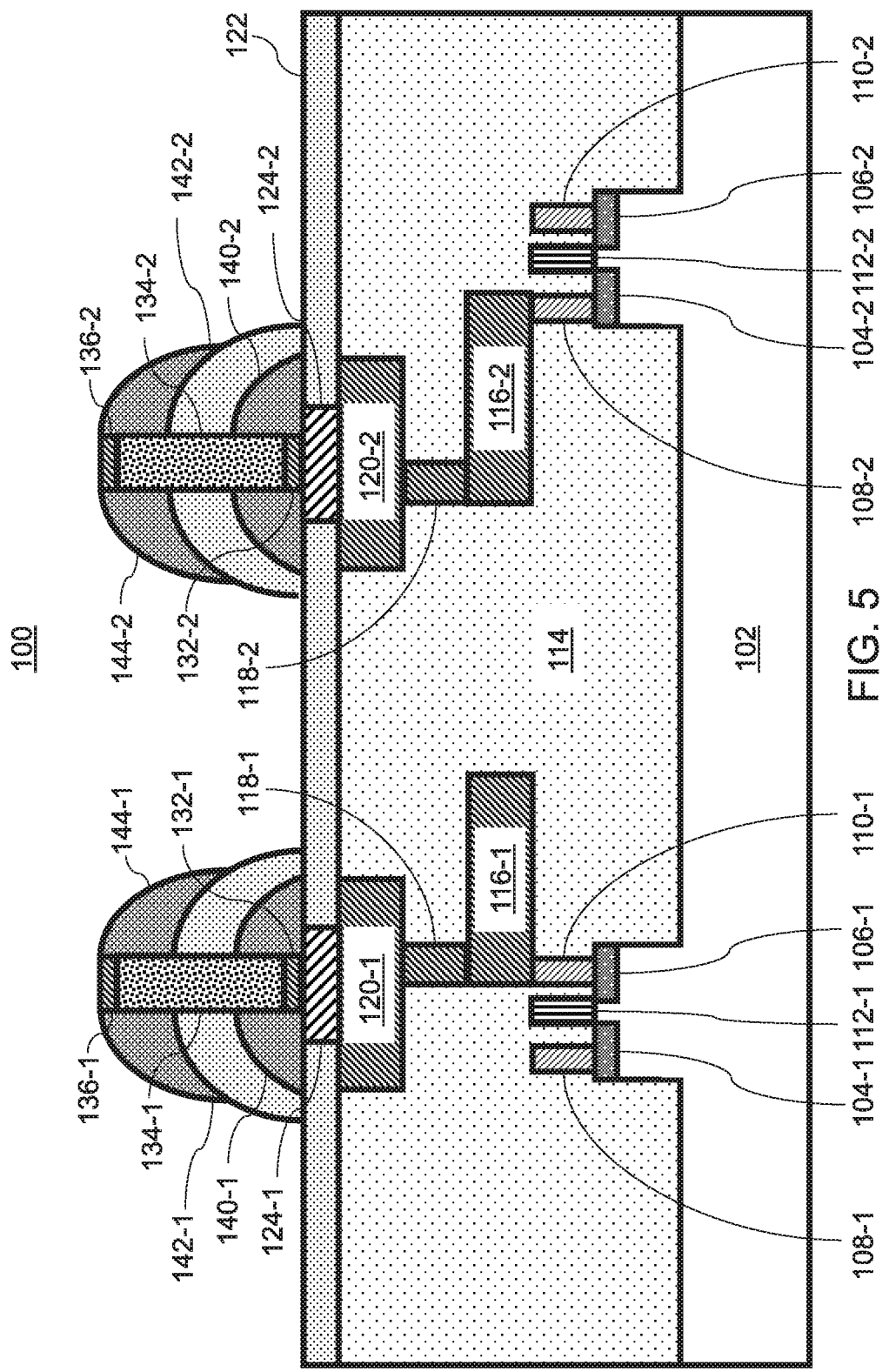
FIG. 5 is a cross-sectional view of the formation of third spacers during the fabrication of the semiconductor device, in accordance with an embodiment of the present invention.

With reference to FIG. 5, third spacers 144-1 and 144-2 are formed on the second spacers 142-1 and 142-2 and the sidewalls of the pillars 130-1 and 130-2, respectively. The third spacers 144-1 and 144-2 can be formed by depositing dielectric material on the device 100 and etching the dielectric material to form the third spacers 144-1 and 144-2 as shown in FIG. 4. The third spacers 144-1 and 144-2 can include any suitable dielectric material in accordance with the embodiments described herein. Examples of suitable dielectric materials that can be used to form the third spacers 144-1 and 144-2 include, but are not limited to, silicon nitride, silicon oxide, amorphous carbon, boron nitride, etc.

As will be described in further detail below with reference to FIG. 6, the spacers 140-1, 140-2, 142-1, 142-2, 144-1 and 144-2 are formed for purposes of forming a modified pillar having a structure suitable for use within a vertically oriented PCM memory structure.

For example, the second spacers 142-1 and 142-2 can be removed selectively to the first spacers 140-1 and 140-2 and the third spacers 144-1 and 144-2, respectively, such that a central portion of the pillars 130-1 and 130-2 can be removed via recessing the PCM materials 134-1 and 134-2 to form a vertical bridge connecting ends of the pillar (which are protected by the first spacers 140-1 and 140-2 and the third spacers 144-1 and 144-2 during the recessing of the PCM materials 134-1 and 134-2 from the pillars 130-1 and 130-2).

Thus, the second spacers 142-1 and 142-2 include a different material from first spacers 140-1 and 140-2. The material of the second spacers 142-1 and 142-2 can be selected to support selective removal of the second spacers 142-1 and 142-2 relative to the first spacers 140-1 and 140-2 and the third spacers 144-1 and 144-2, as will be further described herein below with reference to FIG. 6.

For example, in an embodiment in which the first spacers 140-1 and 140-2 and the third spacers 144-1 and 144-2 include a nitride material, the second spacers 142-1 and 142-2 can include, e.g., an oxide material.

In one embodiment, the third spacers 144-1 and 144-2 can include a same material as the first spacers 140-1 and 140-2. In another embodiment, the third spacers 144-1 and 144-2 can include a different material than the first spacers 140-1 and 140-2. For example, as mentioned above, the first spacers 140-1 and 140-2 and the third spacers 144-1 and 144-2 can include a nitride material and the second spacers 142-1 and 142-2 can include an oxide material. However, such an embodiment should not be considered limiting, and the spacers 140-1, 140-2, 142-1, 142-2, 144-1 and 144-2 can include any suitable materials in accordance with the embodiments described herein.

Figure 6:
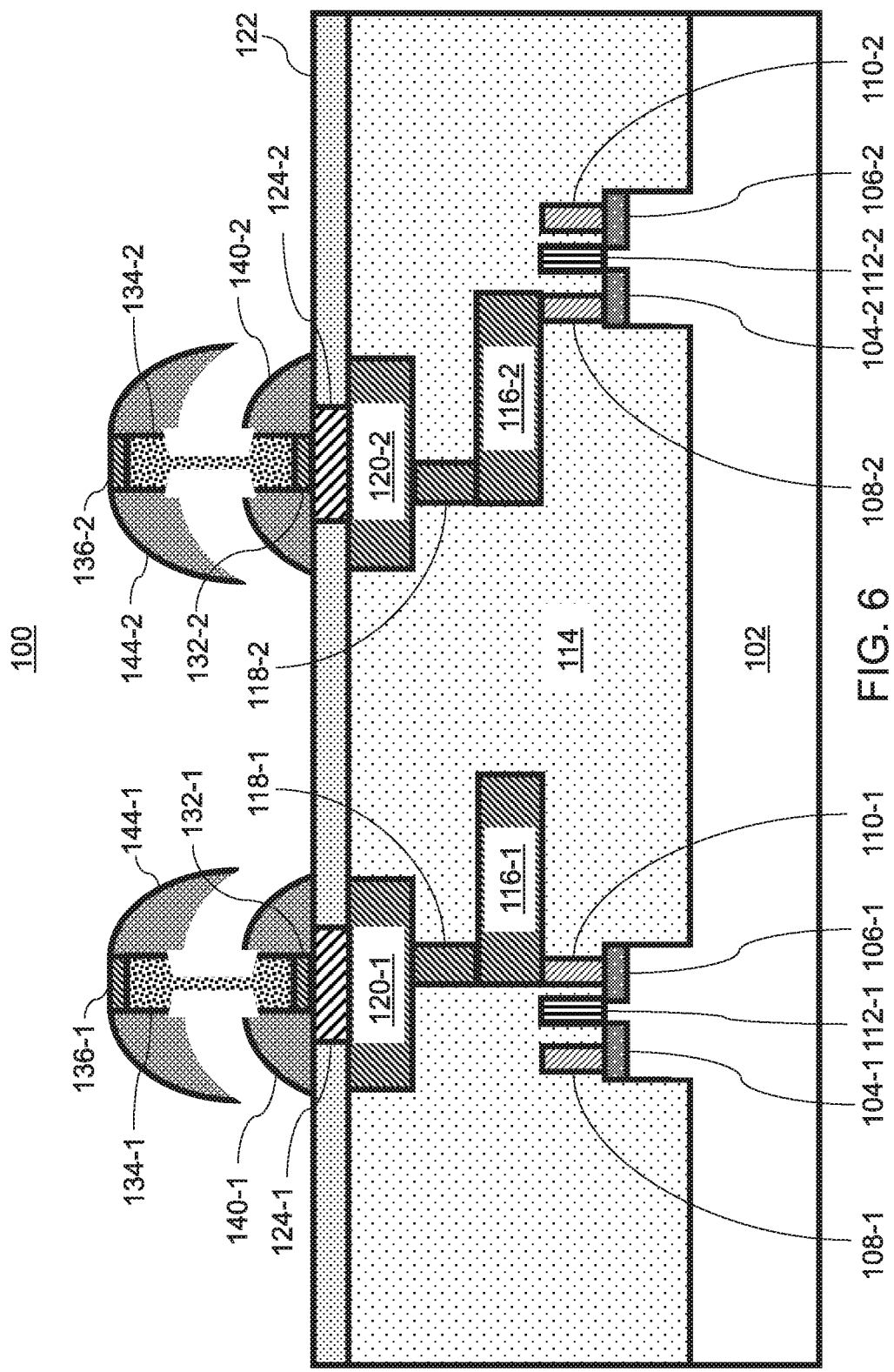
FIG. 6 is a cross-sectional view of the removal of the second spacers and recessing of the PCM material during the fabrication of the semiconductor device, in accordance with an embodiment of the present invention.

With reference to FIG. 6, the second spacers 142-1 and 142-2 are removed and the PCM materials 134-1 and 134-2 are recessed using any suitable processes in accordance with the embodiments described herein. More specifically, a wet etch process can be used to remove the second spacers 142-1 and 142-2, and a wet etch process and/or isotropic reactive-ion etch (RIE) process can be used to recess the PCM materials 134-1 and 134-2. For example, one or more of the wet etch processes can use, e.g., hydrofluoric acid (HF) as an etchant. Slow etch rate can be employed for controllability.

Figure 7:
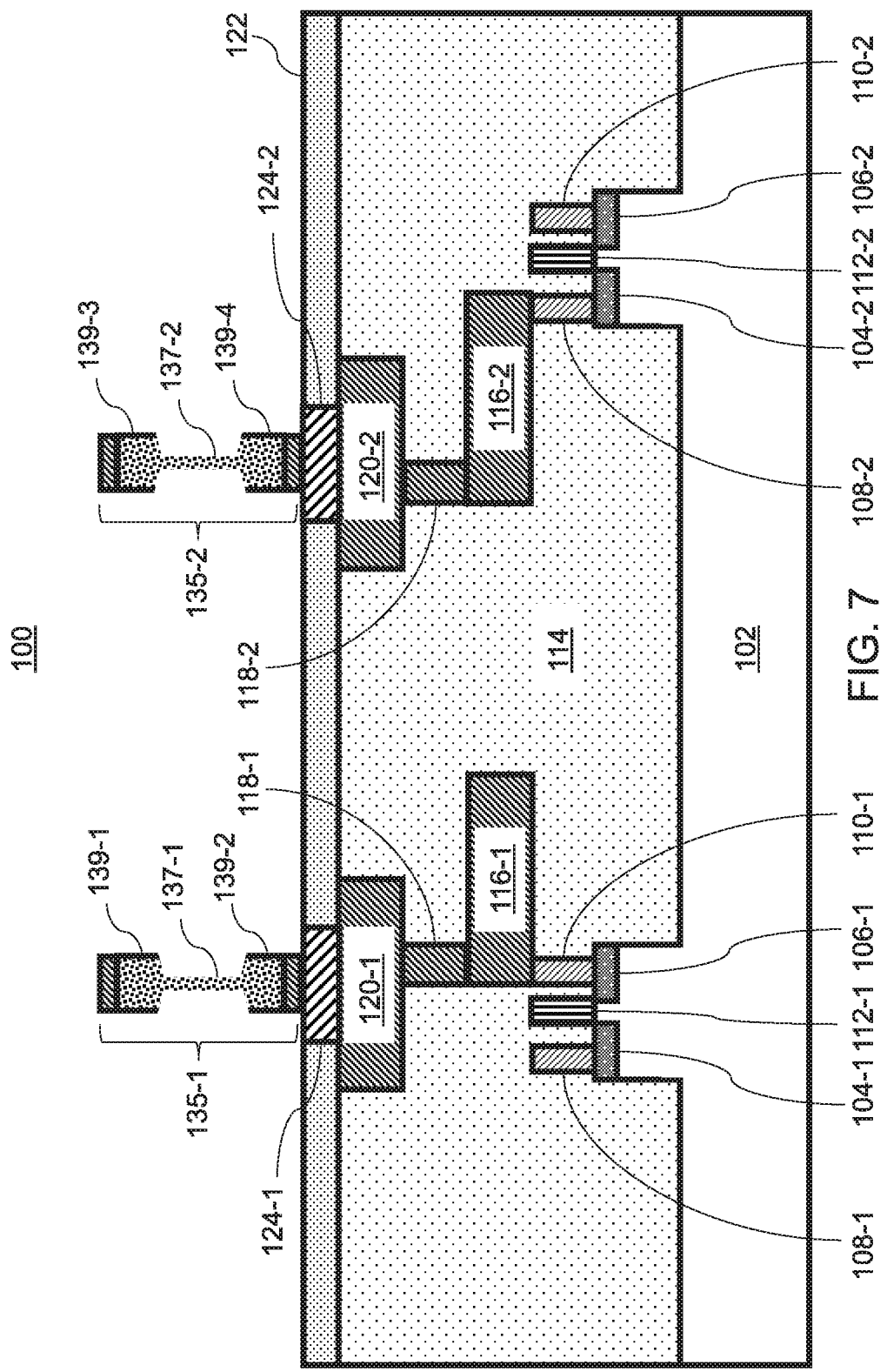
FIG. 7 is a cross-sectional view of the removal of the first and second spacers during the fabrication of the semiconductor device, in accordance with an embodiment of the present invention.

With reference to FIG. 7, the first spacers 140-1 and 140-2 and the third spacers 144-1 and 144-2 are removed using any suitable processes in accordance with the embodiments described herein. For example, if the first spacers 140-1 and 140-2 and the third spacers 144-1 and 144-2 are made from amorphous carbon, an $O_2$ ash can be used to remove the first spacers 140-1 and 140-2 and the third spacers 144-1 and 144-2.

The processing shown in FIGS. 6 and 7 results in the formation of modified pillars 135-1 and 135-2 from the pillars 130-1 and 130-2, respectively. As shown in FIG. 7, the modified pillars 135-1 and 135-2 can have a vertically oriented dumbbell shape. More specifically, the modified pillar 135-1 can have a vertical bridge 137-1 separating ends 139-1 and 139-2, and the modified pillar 135-2 can have a vertical bridge 137-2 separating ends 139-3 and 139-4. The vertical bridges 137-1 and 137-2 are narrower than the ends 139-1 through 139-4.

Figure 8:
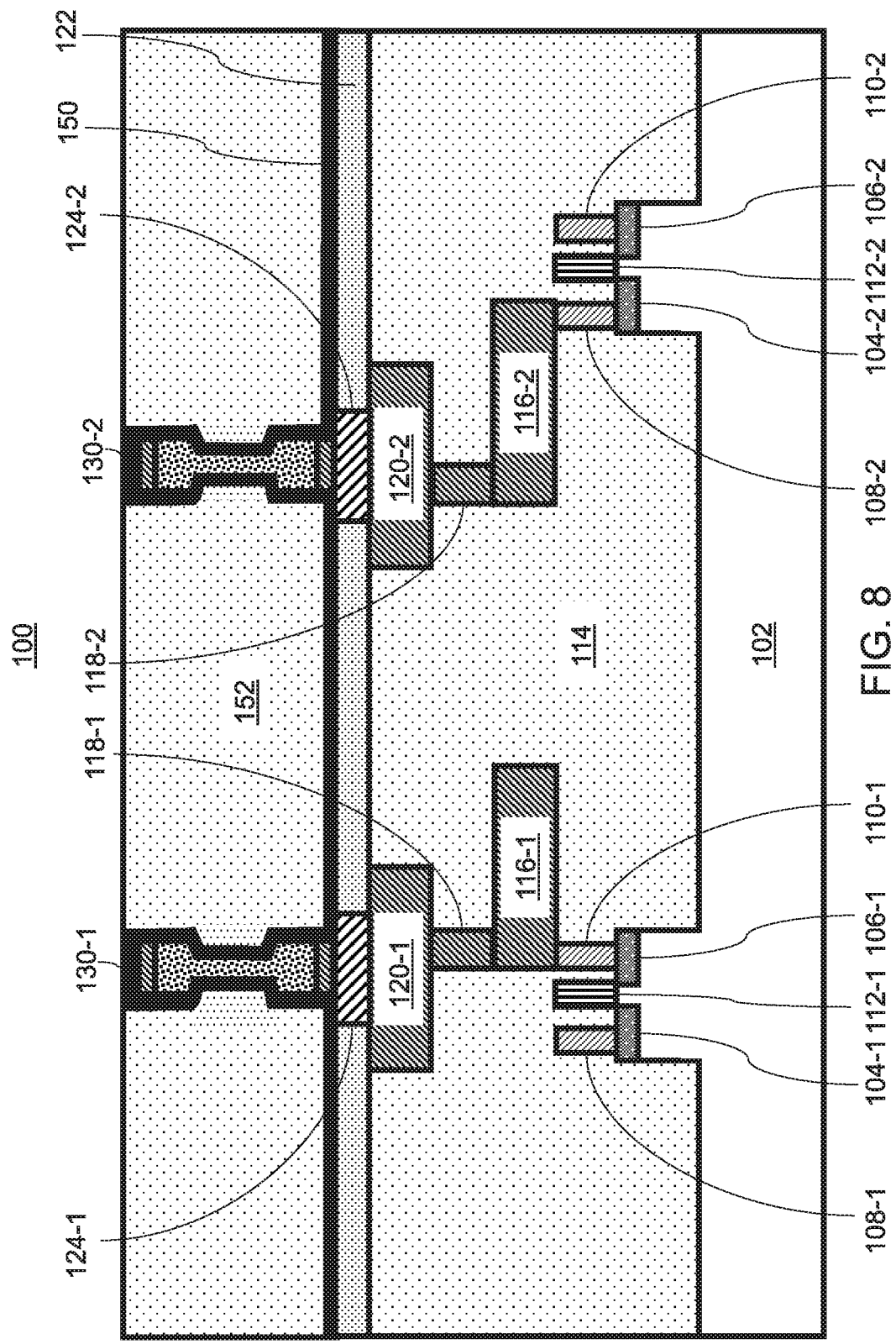
FIG. 8 is a cross-sectional view of the formation of dielectric layers during the fabrication of the semiconductor device, in accordance with an embodiment of the present invention.

With reference to FIG. 8, a conductive layer 150 and a dielectric layer 152 are formed. The conductive layer 150 can be a high resistive conductive layer including a conductive material having a sufficiently high resistivity. Forming the conductive layer 150 can include conformally depositing material along the dielectric capping layer 122 and the remaining portions of the pillars 130-1 and 130-2.

Forming the dielectric layer 152 can include depositing dielectric material on the device 100, and planarizing the dielectric material to about a top surface of the conductive layer 150 on the modified pillars 130-1 and 130-2.

The conductive layer 150 can include any suitable material in accordance with the embodiments described herein. Examples of suitable materials that the conductive layer 150 can be formed from include, but are not limited to, titanium nitride (TiN), tantalum nitride (TaN), etc.

The dielectric layer 152 can include any suitable material in accordance with the embodiments described herein. For example, the dielectric layer 152 can include, e.g., silicon oxide, silicon nitride, boron nitride, a carbon doped oxide (e.g., SiCOH), etc.

Figure 9:
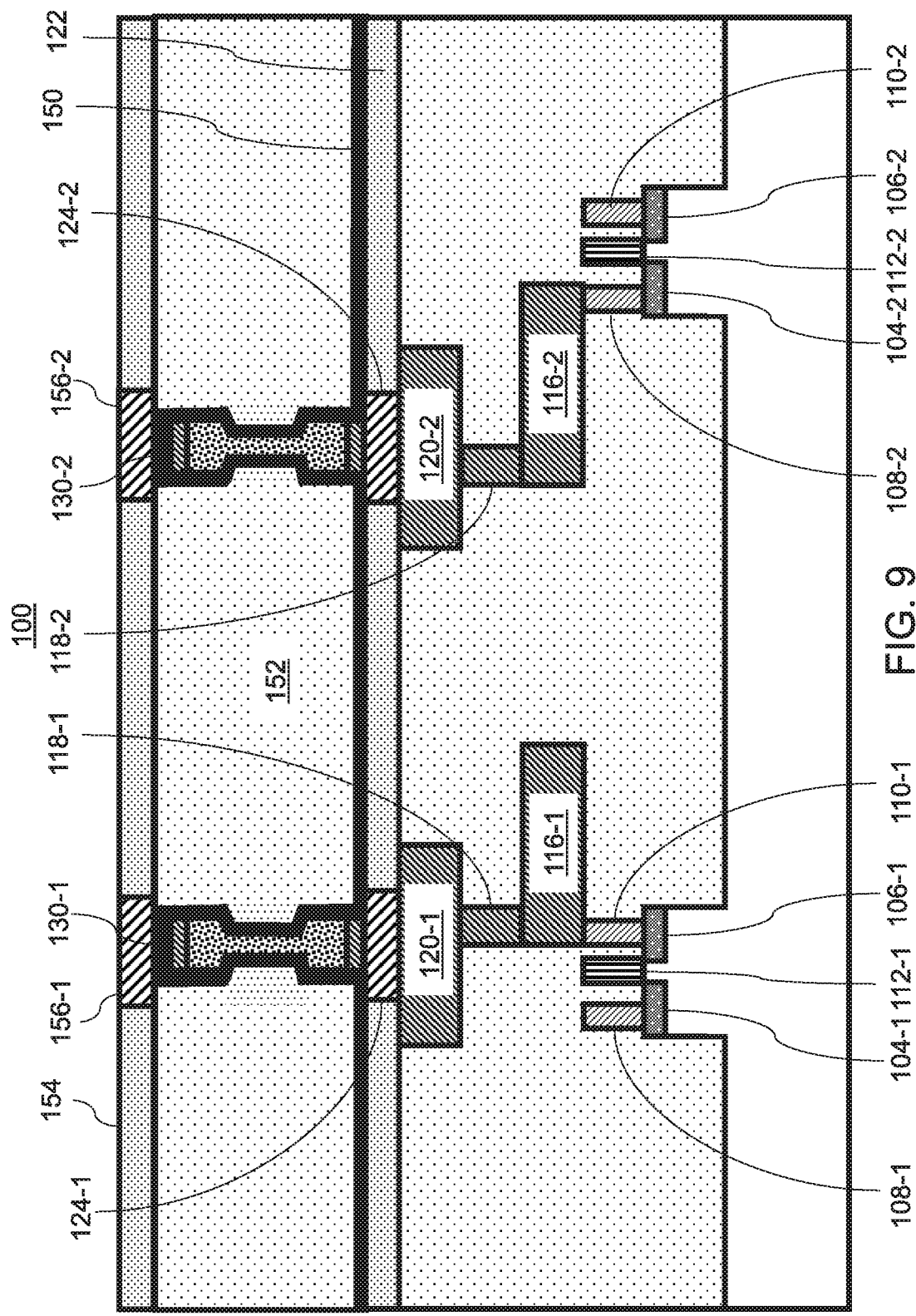
FIG. 9 is a cross-sectional view of the formation of upper electrodes during the fabrication of the semiconductor device, in accordance with an embodiment of the present invention.

With reference to FIG. 9, a dielectric capping layer 154 is formed. The dielectric capping layer 154 can include any suitable dielectric material in accordance with the embodiments described herein. Examples of suitable dielectric materials that the dielectric capping layer 154 can be formed from include, but are not limited to, silicon nitride, silicon oxide, etc.

As further shown, upper electrodes 156-1 and 156-2 are formed within the dielectric capping layer 154 on the pillars 130-1 and 130-2. The upper electrodes 156-1 and 156-2 can include any suitable conductive material in accordance with the embodiments described herein. Examples of suitable materials that the upper electrodes 156-1 and 156-2 can be formed from include, but are not limited to, tungsten (W), copper (Cu), etc.

Figure 10:
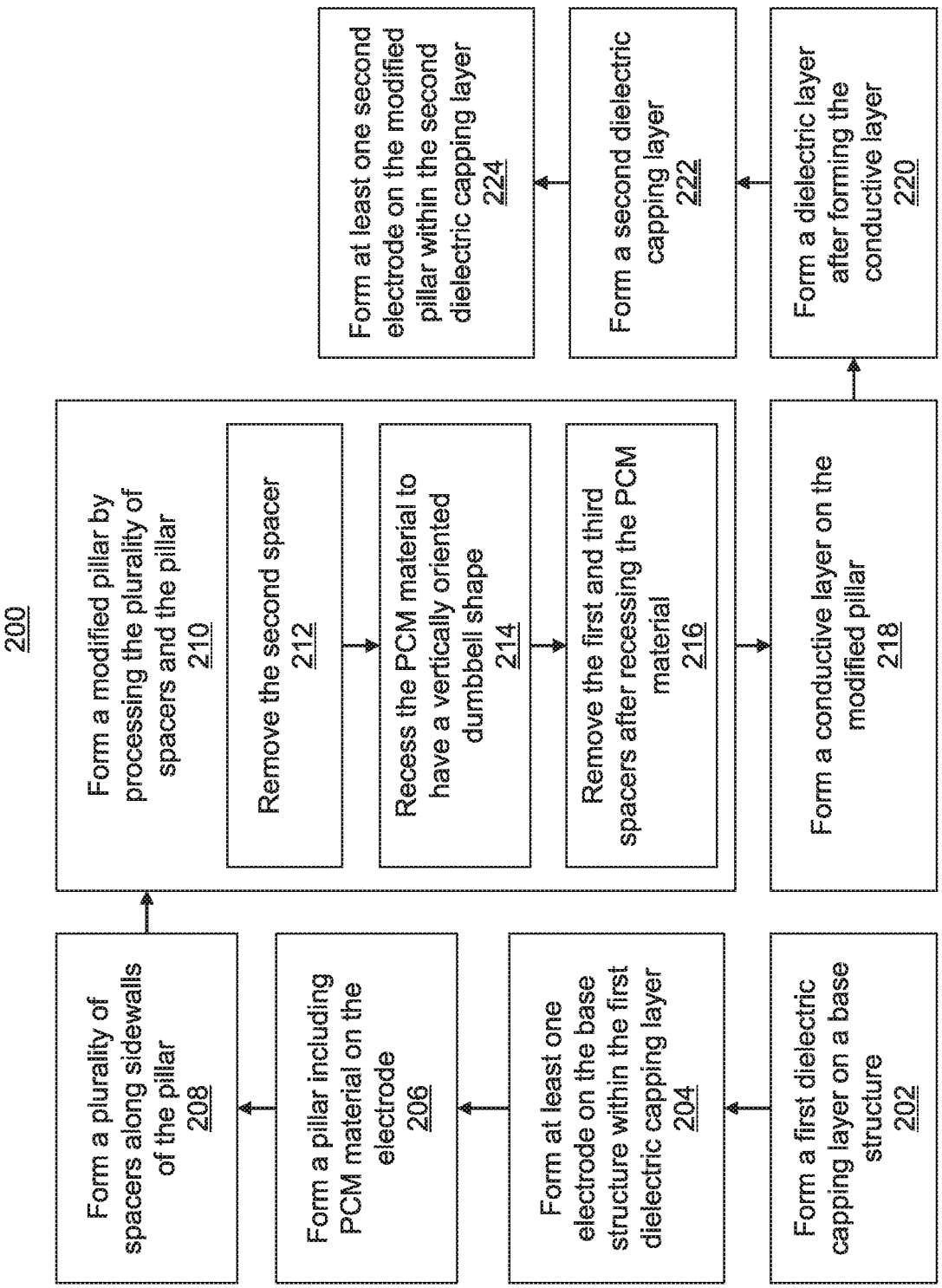
FIG. 10 is a block/flow diagram illustrating a system/method for fabricating a semiconductor device including a vertically constricted memory structure, in accordance with an embodiment of the present invention.

With reference to FIG. 10, a block/flow diagram is shown illustrating a system/method 200 for fabricating a semiconductor device including a vertically oriented memory structure.

At block 202, a first dielectric capping layer is formed on a base structure. The base structure can include FEOL and BEOL structures. Any suitable process can be used to form the first dielectric capping layer in accordance with the embodiments described herein, and the first dielectric capping layer can include any suitable material in accordance with the embodiments described herein.

At block 204, at least one electrode is formed on the base structure within the first dielectric capping layer. For example, the at least one electrode can include at least one lower electrode. Any suitable process can be used to form the at least one electrode in accordance with the embodiments described herein, and the at least one electrode can include any suitable materials in accordance with the embodiments described herein.

At block 206, a pillar including phase-change memory (PCM) material is formed on the electrode. Forming the pillar can include forming a first conductive liner on the electrode, forming the PCM material on the first conductive liner, and forming a second conductive liner on the PCM material. Any suitable processes can be used to form the pillar in accordance with the embodiments described herein, and the pillar can include any suitable materials in accordance with the embodiments described herein.

At block 208, a plurality of spacers are formed on the electrode and along sidewalls of the pillar. Forming the plurality of spacers can include forming a first spacer on the electrode, a second spacer on the first spacer, and a third spacer on the second spacer. Any suitable processes can be used to form the plurality of spacers in accordance with the embodiments described herein.

As will be described in further detail below and as described above with reference to FIGS. 5-7, the plurality of spacers are formed for purposes of forming a modified pillar having a structure suitable for use within a vertically oriented PCM memory structure.

For example, the second spacer can be removed selectively to the first and third spacers, such that a central portion of the pillar can be removed via recessing the PCM material to form a vertical bridge without affecting ends of the pillar (which are protected by the first and third spacers during the recessing of the PCM materials from the pillar).

Thus, the second spacer can include a different material from both the first and third spacers. The material of second spacers can be selected to support selective removal of second spacers relative to first and third spacers. For example, in an embodiment in which first and third spacers include a nitride material, second the second can include, e.g., an oxide material.

In one embodiment, the first and third spacers include a same material. In another embodiment, the first and third spacers include a different material. For example, as mentioned above, the first and third spacers can include a nitride material and the second spacer can include an oxide material. However, such an embodiment should not be considered limiting, and the plurality of spacers can include any suitable materials in accordance with the embodiments described herein.

At block 210, a modified pillar is formed by processing the plurality of spacers and the pillar. The modified pillar can have a vertically oriented dumbbell shape associated with a vertically oriented PCM memory structure. Any suitable process can be used to process the plurality of spacers and the pillar to form the modified pillar in accordance with the embodiments described herein.

For example, as mentioned above, forming the modified pillar by processing the plurality of spacers and the pillar can include, at block 212, removing the second spacer and, at block 214, recessing the PCM material to have the vertically oriented dumbbell shape. Any suitable processes can be used to remove the second spacer and recess the PCM material in accordance with the embodiments described herein.

More specifically, the second spacer can be removed using a wet etch process. In one embodiment, after the second spacer is removed, recessing the PCM material can include using a wet etch process. In another embodiment, after the second spacer is removed, recessing the PCM material can include using an isotropic RIE process. For example, one or more of the wet etch processes can use, e.g., hydrofluoric acid (HF) as an etchant. Slow etch rate can be employed for controllability.

Forming the modified pillar by processing the plurality of spacers and the pillar can include, at block 216, removing the first and third spacers after recessing the PCM material. Any suitable process can be used to remove the first and third spacers in accordance with the embodiments described herein.

At block 218, a conductive layer is formed on the modified pillar. The conductive layer can be a high resistive conductive layer including a conductive material having a sufficiently high resistivity for purposes of a vertical oriented PCM memory cell, in accordance with the embodiments described herein.

For example, the conductive layer can be conformally formed (e.g., conformally deposited) along the modified pillar. Any suitable process can be used to form the conductive layer in accordance with the embodiments described herein, and the conductive layer can include any suitable material in accordance with the embodiments described herein.

At block 220, a dielectric layer is formed after forming the conductive layer. Any suitable process can be used to form the dielectric layer in accordance with the embodiments described herein, and the dielectric layer can include any suitable material in accordance with the embodiments described herein.

At block 222, a second dielectric capping layer is formed. Any suitable process can be used to form the second dielectric capping layer in accordance with the embodiments described herein, and the second dielectric capping layer include any suitable materials in accordance with the embodiments described herein.

At block 224, at least one second electrode is formed on the modified pillar within the second dielectric capping layer. For example, the at least one second electrode can include at least one upper electrode. Any suitable process can be used to form the at least one second electrode in accordance with the embodiments described herein, and the at least one second electrode can include any suitable material in accordance with the embodiments described herein.

Further details regarding blocks 202-224 are described above with reference to FIGS. 1-9.

Having described preferred embodiments of a semiconductor device including a vertically oriented memory structure and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including a vertically oriented memory structure, comprising:
    forming at least one pillar including phase-change memory (PCM) material on at least one electrode;
    forming a plurality of spacers on the electrode and along sidewalls of the pillar; and
    forming, by etching the plurality of spacers and the pillar, a modified pillar having a vertically oriented dumbbell shape associated with a vertically oriented PCM memory structure.

2. The method of claim 1, further comprising forming the electrode on a base structure within a dielectric capping layer.

3. The method of claim 1, wherein forming the pillar further includes forming a first conductive liner on the electrode, forming the PCM material on the first conductive liner, and forming a second conductive liner on the PCM material.

4. The method of claim 1, wherein forming the plurality of spacers along the sidewalls of the pillar includes forming a first spacer on the electrode, a second spacer on the first spacer, and a third spacer on the second spacer.

5. The method of claim 4, wherein the first and third spacers include a nitride material and the second spacer includes an oxide material.

6. The method of claim 4, wherein forming the modified pillar further includes:
   removing the second spacer using a wet etch process; and
   recessing the PCM material to have the vertically oriented dumbbell shape.

7. The method of claim 6, wherein recessing the PCM material further includes using a wet etch process.

8. The method of claim 6, wherein recessing the PCM material further includes using an isotropic reactive-ion etch process.

9. The method of claim 6, wherein processing the plurality of spacers and the pillar to form the modified pillar further includes removing the first and third spacers after recessing the PCM material.

10. The method of claim 9, further comprising forming a conductive layer conformally along the modified pillar.

11. The method of claim 10, further comprising forming a dielectric layer after forming the conductive layer.

12. The method of claim 1, further comprising forming at least one second electrode on the modified pillar within a dielectric capping layer.

13. A method for fabricating a semiconductor device including a vertically oriented memory structure, comprising:
   forming at least one electrode on a base structure within a first dielectric capping layer;
   forming a pillar including phase-change memory (PCM) material on the electrode, including forming a first conductive liner on the electrode, forming the PCM material on the first conductive liner, and forming a second conductive liner on the PCM material;
   forming a plurality of spacers on the electrode and along sidewalls of the pillar, including forming a first spacer on the electrode, a second spacer on the first spacer, and a third spacer on the second spacer; and
   forming, by processing the plurality of spacers and the pillar, a modified pillar having a vertically oriented dumbbell shape associated with a vertically oriented PCM memory structure, including:
   removing the second spacer using a wet etch process; and
   recessing the PCM material to have the vertically oriented dumbbell shape.

14. The method of claim 13, wherein the first and third spacers include a nitride material and the second spacer includes an oxide material.

15. The method of claim 13, wherein recessing the PCM material further includes using a wet etch process.

16. The method of claim 13, wherein recessing the PCM material further includes using an isotropic reactive-ion etch process.

17. The method of claim 13, wherein forming the modified pillar further includes removing the first and third spacers after recessing the PCM material.

18. The method of claim 13, further comprising forming a conductive layer conformally along the modified pillar, and forming a dielectric layer after forming the conductive layer.

19. The method of claim 18, further comprising forming at least one second electrode on the modified pillar within a second dielectric capping layer.

20. A semiconductor device including a vertically oriented memory structure, comprising:
   a base structure;
   at least one electrode disposed on the base structure within a first dielectric capping layer;
   a modified pillar disposed on the electrode, the modified pillar having a vertically oriented dumbbell shape associated with a vertically oriented phase-change memory (PCM) memory structure including dumbbell shaped PCM material disposed between conductive liners; and
   a second electrode disposed on the modified pillar within a second dielectric capping layer.

* * * * *